United States Patent
Cox et al.

(10) Patent No.: US 9,814,155 B2
(45) Date of Patent: Nov. 7, 2017

(54) ADJUSTABLE COMPUTING COMPONENT RACK

(71) Applicant: INTERNATIONAL BUSINESS MACHINES CORPORATION, Armonk, NY (US)

(72) Inventors: Aaron R. Cox, Tucson, AZ (US); Jason E. Minyard, Phoenix, AZ (US); Camillo Sassano, Durham, NC (US); Kevin L. Schultz, Raleigh, NC (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/835,431

(22) Filed: Aug. 25, 2015

(65) Prior Publication Data

US 2017/0064858 A1 Mar. 2, 2017

(51) Int. Cl.
*H05K 7/00* (2006.01)
*H05K 7/14* (2006.01)

(52) U.S. Cl.
CPC ................. *H05K 7/1488* (2013.01)

(58) Field of Classification Search
None
See application file for complete search history.

(56) References Cited

U.S. PATENT DOCUMENTS

| | | | | |
|---|---|---|---|---|
| 3,048,899 A | * | 8/1962 | Vincent | E05D 15/502 16/232 |
| 4,314,733 A | * | 2/1982 | Smith | B42F 17/02 211/50 |
| 5,076,649 A | * | 12/1991 | Therkelsen | A47B 77/04 312/246 |
| 5,443,312 A | * | 8/1995 | Schluter | H05K 7/1488 312/201 |
| 6,471,308 B1 | | 10/2002 | Konshak et al. | |
| 6,772,887 B2 | * | 8/2004 | Audibert | G02B 6/4455 211/26 |
| 7,800,920 B2 | * | 9/2010 | Ostrowski | H02B 11/127 211/26 |
| 7,826,233 B2 | * | 11/2010 | Connor | H02B 11/127 361/741 |
| 8,567,883 B2 | * | 10/2013 | Hsiao | H05K 7/1489 312/201 |
| 8,607,996 B2 | * | 12/2013 | Yang | H05K 7/1488 211/162 |
| 9,054,449 B2 | * | 6/2015 | Utz | H01R 13/5812 |

(Continued)

OTHER PUBLICATIONS

AXS Series, Slide Out Rack in Steel Enclosure, 2 pages, Retrieved Sep. 25, 2014 from http://www.middleatlantic.com/products/racks-enclosures/slide-out-racks.aspx?utm_source=/products/racks-enclosures/slide-out-racks&utm_medium=redirect, 2014 Middle Atlantic.

(Continued)

*Primary Examiner* — Courtney Smith
*Assistant Examiner* — Rashen E Morrison
(74) *Attorney, Agent, or Firm* — Griffiths & Seaton PLLC (57) ABSTRACT

A rack system for mounting a plurality of computing components includes an inner cabinet, and an outer cabinet adjustably coupled to the inner cabinet. The outer cabinet is selectively movable laterally over the inner cabinet to promote flexibility in configuring the plurality of computing components within the inner cabinet in three dimensional space.

9 Claims, 5 Drawing Sheets

(56) References Cited

U.S. PATENT DOCUMENTS

| | | | | |
|---|---|---|---|---|
| 9,516,485 B1* | 12/2016 | Bowers | .................. | H04W 4/22 |
| 9,565,936 B2* | 2/2017 | Chen | .................... | A47B 88/956 |
| 9,572,276 B2* | 2/2017 | Haroun | ................ | H05K 7/1485 |
| 2004/0100173 A1* | 5/2004 | Jakob-Bamberg | ..... | A47B 88/42 |
| | | | | 312/330.1 |
| 2004/0201335 A1 | 10/2004 | Davis | | |
| 2007/0210679 A1* | 9/2007 | Adducci | ................ | H02B 1/202 |
| | | | | 312/7.2 |
| 2009/0267470 A1* | 10/2009 | Compagnucci | ........ | A47B 88/42 |
| | | | | 312/311 |
| 2011/0181160 A1* | 7/2011 | Peng | ...................... | H02B 1/301 |
| | | | | 312/223.1 |
| 2011/0226505 A1* | 9/2011 | Mackin | .................. | H05K 7/186 |
| | | | | 174/50.5 |
| 2011/0271610 A1* | 11/2011 | Cottuli | ............... | H05K 7/20745 |
| | | | | 52/173.1 |
| 2012/0104918 A1* | 5/2012 | Peng | .................... | H05K 7/1497 |
| | | | | 312/334.27 |
| 2012/0194049 A1* | 8/2012 | Cook | .................... | H05K 7/186 |
| | | | | 312/236 |
| 2013/0165035 A1* | 6/2013 | Krietzman | ......... | H05K 7/20745 |
| | | | | 454/184 |
| 2016/0128474 A1* | 5/2016 | Chen | .................... | A47B 88/956 |
| | | | | 312/333 |

OTHER PUBLICATIONS

WR Series, Roll Out Rotating Rack, 2 pages, Retrieved Sep. 25, 2014, from http://www.middleatlantic.com/products/racks-enclo-sures/slide-out-rack, 2014 Middle Atlantic.

* cited by examiner

ADJUSTABLE COMPUTING COMPONENT RACK

BACKGROUND OF THE INVENTION

Field of the Invention

The present invention relates in general to racks for mounting computer components, and in particular, to an adjustable rack for receiving and covering the computing components.

Description of the Related Art

Servers are typically made up of electronic components that include processors and their associated electronics (e.g., memory, disk drives, power supplies, etc.) packaged in removable node configurations. These electronic components are generally stacked and/or mounted within an electronics (or IT) rack or frame, either in drawers in the rack or frame or at fixed locations thereon. As electronic components from different manufacturers evolve and become more complex, so too does the configuration of such components within the IT racks themselves.

SUMMARY OF THE DESCRIBED EMBODIMENTS

Various embodiments for a rack system for mounting a plurality of computing components are provided. In one embodiment, a rack system comprises an inner cabinet; and an outer cabinet, the outer cabinet adjustably coupled to the inner cabinet; wherein the outer cabinet is selectively movable laterally over the inner cabinet to promote flexibility in configuring the plurality of computing components within the inner cabinet in three dimensional space.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

The following detailed description of the invention merely provides exemplary embodiments and is not intended to limit the invention of the application and uses of the invention. Furthermore, there is no intention to be bound by any theory presented in the preceding background of the invention of the following detailed description of the invention.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

As aforementioned, servers are typically made up of electronic components that include processors and their associated electronics (e.g., memory, disk drives, power supplies, etc.) packaged in removable node configurations. These electronic components are generally stacked and/or mounted within an electronics (or IT) rack or frame, either in drawers in the rack or frame or at fixed locations thereon. As electronic components from different manufacturers evolve and become more complex, so too does the configuration of such components within the IT racks themselves.

Data center customers often align their racks into rows with clearance aisles for service access. Consistent rack depth and aisle width are critical to maintain ease of access and maximize data center footprint efficiency. Often times, customers are also installing different kinds of hardware into their racks. Some hardware requires more cable clearance in the rear of the rack, and other hardware might require more cable clearance in the front of the rack. Cabling on the front of servers is a somewhat new concept, yet a growing reality.

Data center customers need the flexibility of providing extra cable clearance (interior rack depth space) in the front or rear of their racks, based on the unique servers in a given rack. Ideally, these front/rear rack depth adjustments would be possible without changing the total rack foot print thus preserving uniformity of rack and aisle dimensions. Customers may purchase deeper racks, or rack extension kits, however, both solutions require forethought of constantly changing equipment configurations, create an un-uniform row when mixed with standard racks, and do not provide cabling clearance to the front of the rack.

Accordingly, the present invention, in one embodiment, provides a rack system for mounting a plurality of computing components which includes an inner cabinet, and an outer cabinet adjustably coupled to the inner cabinet. The outer cabinet is selectively movable laterally over the inner cabinet to promote flexibility in configuring the plurality of computing components within the inner cabinet in three dimensional space.

The present invention consists of a rack where the external covers are allowed to "float" so that their position can be altered relative to the internal rack posts, allowing users to control where the external covers are positioned, and provides the ability to adjust/balance the front and rear depths to provide internal clearance where it is needed in each the particular circumstances. The present invention provides a built in, tool-less rack depth adjustment that doesn't change aisle clearance dimensions (rack retains the same overall external dimensions), that can be re-adjusted without additional parts/tools when rack clearance needs to be changed, and provides a single rack design can accommodate multiple depth requirements within a data center.

Figure 1:
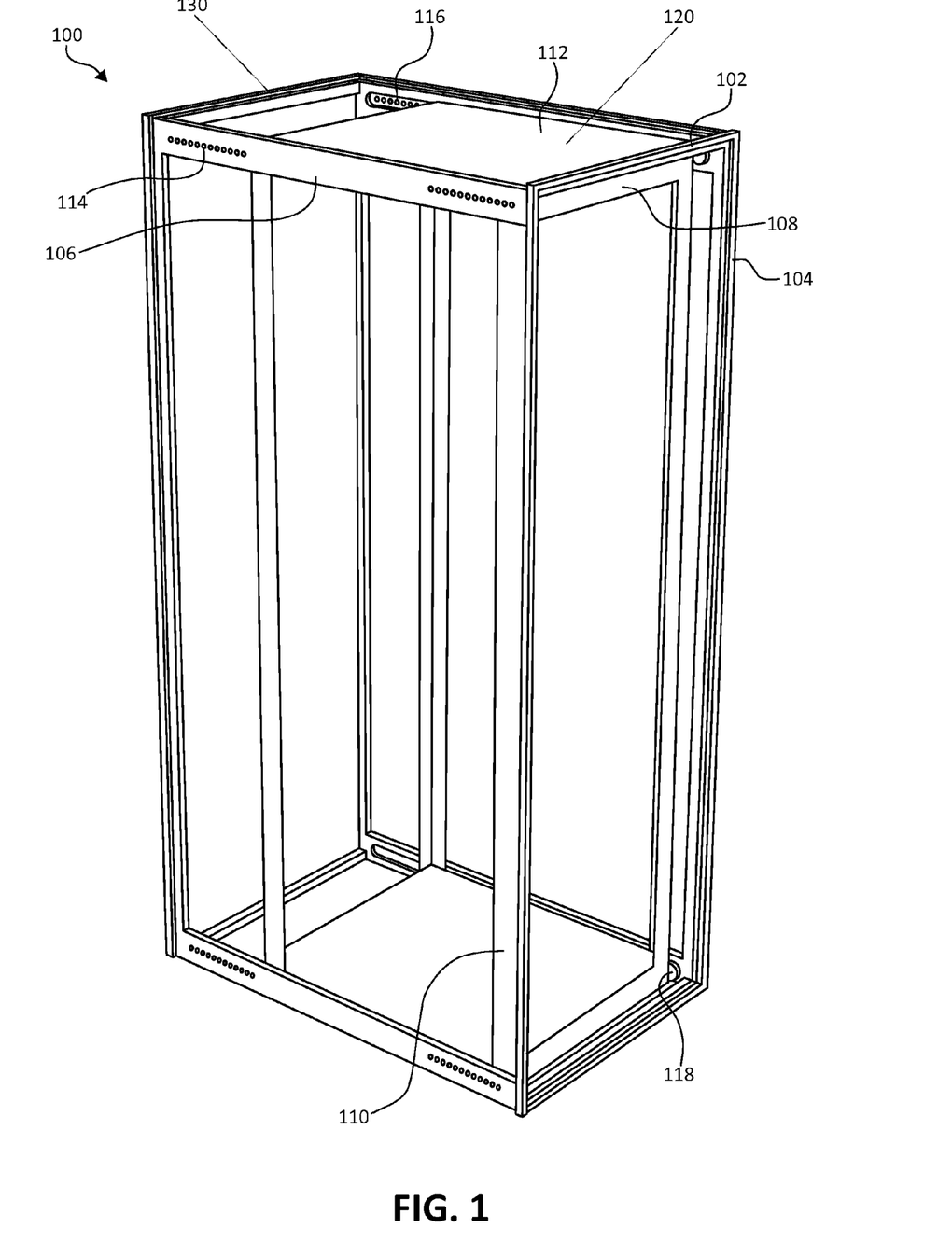
FIG. 1 illustrates a perspective view of a rack for computing components according to aspects of the present invention.

Turning now to FIG. 1, there is shown a perspective view of a computing component rack system 100 incorporating features of the invention. Again, although the invention will be described with reference to the exemplary embodiments shown in the drawings, it should be understood that the invention can be embodied in many alternate forms of embodiments. In addition, any suitable size, shape or type of elements or materials could be used.

In one embodiment, rack system 100 comprises a stationary inner cabinet 120, and an adjustable outer cabinet 130 thereupon. The inner cabinet 120 may comprise a frame structure having vertical posts 110, and horizontal rails 108. In some embodiments, each of the plurality of rails 108 may be substantially the same size, creating a box such structure. In other embodiments, the lateral rails 108 of the opposing sides may be varying lengths, creating a rectangle such structure. The inner cabinet 120 may further comprise opposing lateral top and bottom plates 112 formed at either of a top and bottom ends of posts 110. Posts 110 may have formed vertically a plurality of rack shelves, detents, pins, or apertures for accepting and engaging a plurality of computing components stored therein. In some embodiments, the inner cabinet 120 may have formed enclosing side wall sections connected and extending between posts 110. In other embodiments, the inner cabinet 120 may have a frame structure only, comprising posts 110 and rails 108. At either top and opposing bottom corners of inner cabinet 120, a plurality of guide wheels 118 are formed and fastened to the frame of inner cabinet 120 onto rails 108 for guiding the inner cabinet 120 in a selectively lateral direction either frontward or rearward. Note also that that the top and bottom plates 112 formed on either end of the inner cabinet 120 may extend as one continuous section to include rails 108.

The outer cabinet 130 may comprise a frame structure having vertical posts 104, and horizontal front and rear rails 102, and horizontal side rails 106. In some embodiments, each of the plurality of front and rear rails 102 may be substantially the same size as side rails 106, creating a box such structure. In other embodiments, the front and rear rails 102 may be of varying length compared to side rails 106, creating a rectangle such structure. The outer cabinet 130 may further comprise opposing lateral top and bottom plates (not pictured) formed at either of a top and bottom ends of posts 104. In some embodiments, the outer cabinet 130 may have formed enclosing side wall sections connected and extending between posts 104. In other embodiments, the outer cabinet 130 may have a frame structure only, comprising posts 104, front and rear rails 102, and side rails 106. Formed into either top and opposing bottom side rails 106 is a track system 116. The track system 116 is a notched depth running parallel on an inside edge of side rails 106 for accepting the guide wheels 118. Side rails 106 include each a plurality of apertures 114 formed through for accepting a fastening receptacle. Apertures 114 allow for a securing the outer cabinet 130 after it has been selectively adjusted atop inner cabinet 120.

In one embodiment, rails 108 of the inner cabinet 120 are sized to be slightly shorter than, and for positioning between the front and rear rails 102 of the outer cabinet 130. Likewise, the rails 108 extending on either side of inner cabinet 120 are sized to substantially shorter than, and for positioning between the side rails 106 of the outer cabinet 130. In other words, the inner cabinet 120 is positioned such within the outer cabinet 130 as to provide a selectable depth clearance between the inner cabinet 120 and the outer cabinet 130 in either a frontward or rearward configuration. Posts 110 of the inner cabinet 120 may also be substantially the same height or slightly shorter than posts 104 of the outer cabinet 130.

Figure 2:
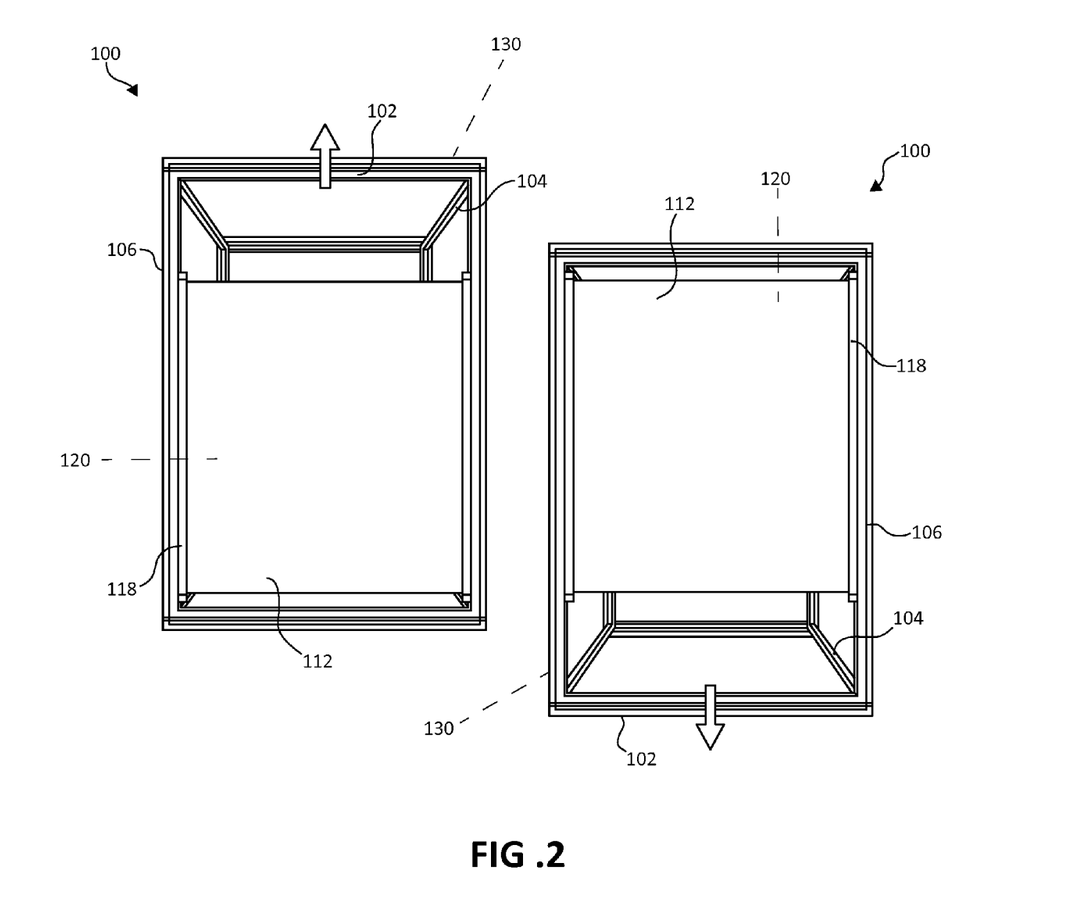
FIG. 2 illustrates a top view of a rack for computing components according to aspects of the present invention.

FIG. 2 illustrates a top sectional view of the rack system 100 in multiple configurations. Shown is the stationary inner cabinet 120 positioned inside the adjustable outer cabinet 130. Seen best in FIG. 2 are the top plate 112 and the assembly of guide wheels 118 of the inner cabinet 120, and the front and rear rails 102, side rails 106, and posts 104 of the outer cabinet 130. FIG. 2 illustrates the adjustable depth feature of the inner cabinet 120 in relation to the outer cabinet 130. In one position, the outer cabinet 130 may be moved substantially to a "back" of the inner cabinet 120. In an alternative position, the outer cabinet 130 may be moved substantially to a "front" of the inner cabinet 120. The guide wheels 118 riding in track 116, and securing in apertures 114 allow for adjusting the configuration of the outer cabinet 130 in a plurality of positions in reference to the inner cabinet 120. This provides a selectable depth of clearance for computing components, cabling, or other peripheral devices thereof stored inside or on the inner cabinet 120, while providing a uniform size solution for a data center having many rack systems 100 therein.

Figure 3:
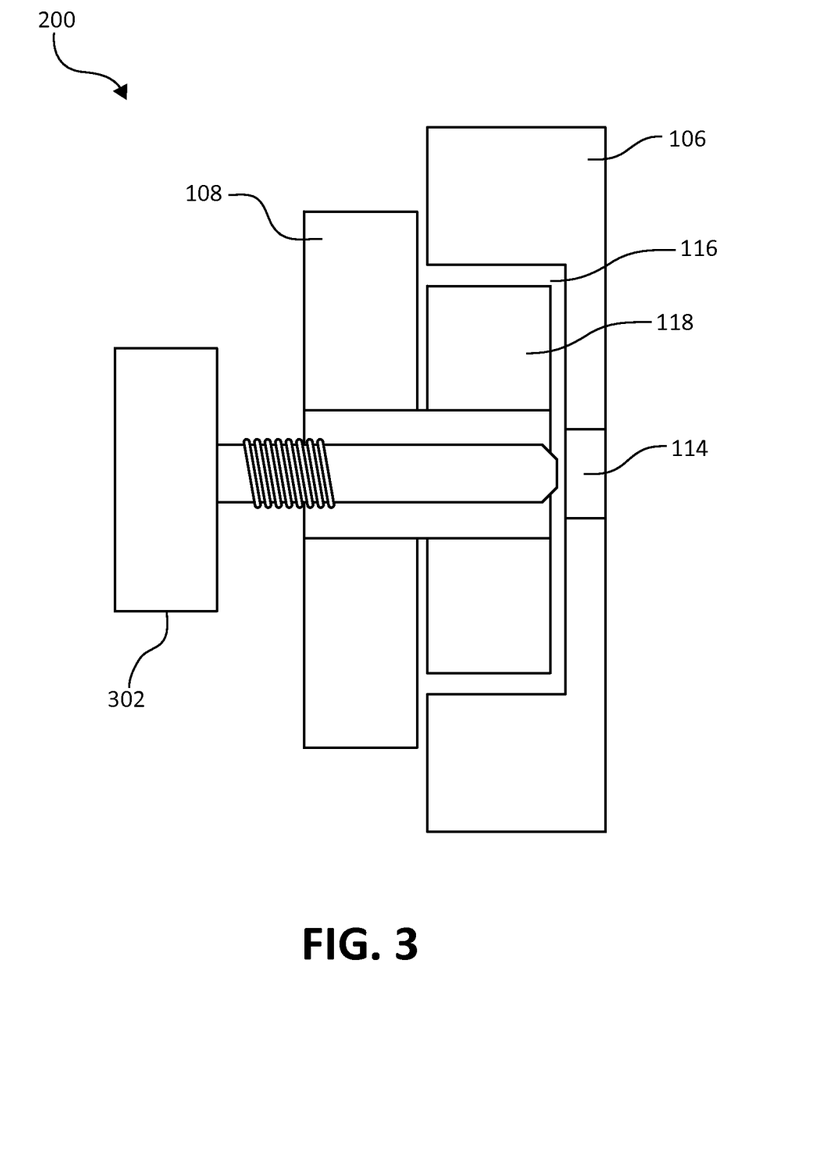
FIG. 3 illustrates a sectional view of a latching mechanism, according to aspects of the present invention.

Continuing to FIG. 3, a perspective internal view of a latching mechanism 200 is illustrated. Shown is a sectional view of a side rail 106 of the outer cabinet 130. The side rail 106 has a track system 116 in which guide wheels 118 ride upon and between. Guide wheels 118 are affixed to the lateral rails 108 of the top and opposing bottom of the inner cabinet 120. Formed through rails 108, and guide wheels 118, are apertures for accepting a screw pin 302. Screw pin 302 extends from the inside edge of rails 108 of the inner cabinet 120, through guide wheels 118, and ultimately engage in one of the plurality of apertures 114 of the side rails 106 of the outer cabinet 130. FIG. 3 illustrates the latching mechanism 200 with the screw pin 302 disengaged through an aperture 114, allowing the outer cabinet 130 to be selectively positioned for configuring a front to back depth ratio for a desired clearance of the computing components stored within the inner cabinet 120.

Figure 4:
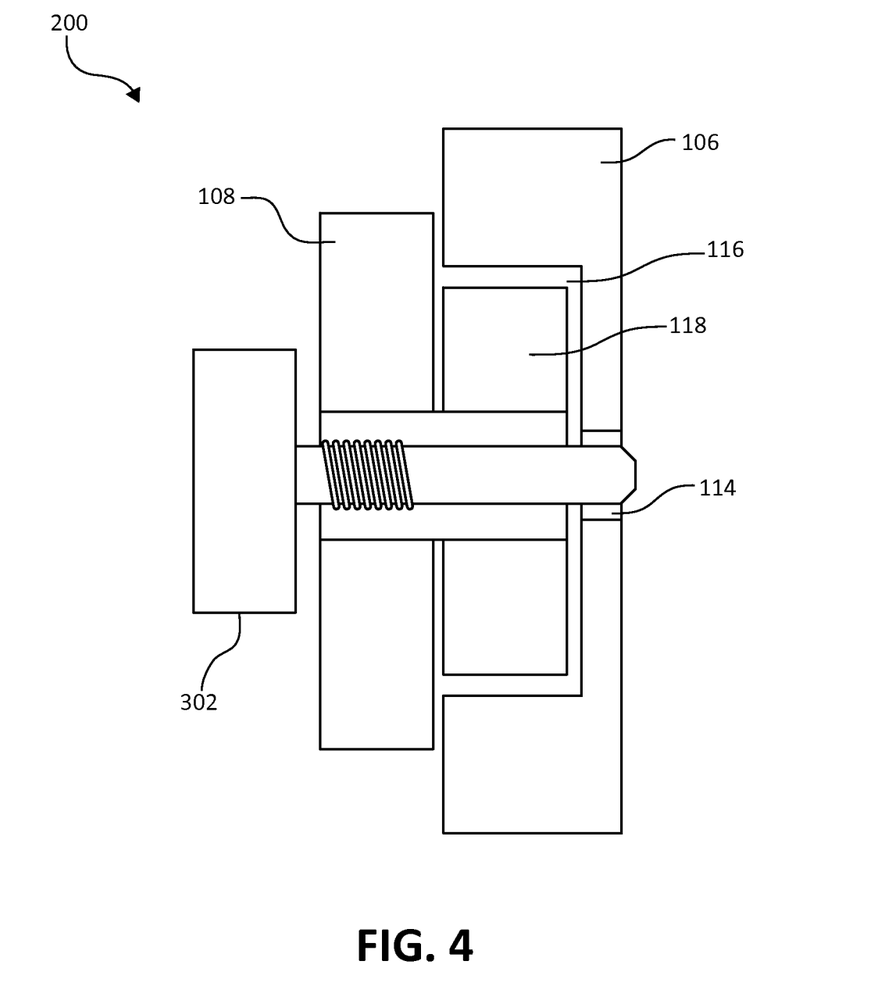
FIG. 4 illustrates an additional sectional view of a latching mechanism according to aspects of the present invention.

FIG. 4 illustrates an additional perspective internal view of the latching mechanism 200. Shown is a sectional view of side rail 106 of the outer cabinet 130. The side rail 106 has a track system 116 in which guide wheels 118 ride upon and between. Guide wheels 118 are affixed to the lateral rails 108 of the top and opposing bottom of the inner cabinet 120. Formed through rails 108, and guide wheels 118, are apertures for accepting a screw pin 302. Screw pin 302 extends from the inside edge of rails 108 of the inner cabinet 120, through guide wheels 118, and ultimately engage in one of the plurality of apertures 114 of the side rails 106 of the outer cabinet 130. FIG. 4 illustrates the latching mechanism 200 with the screw pin 302 engaged through an aperture 114, for securing the outer cabinet 130 in a storage position over the inner cabinet 120.

Figure 5:
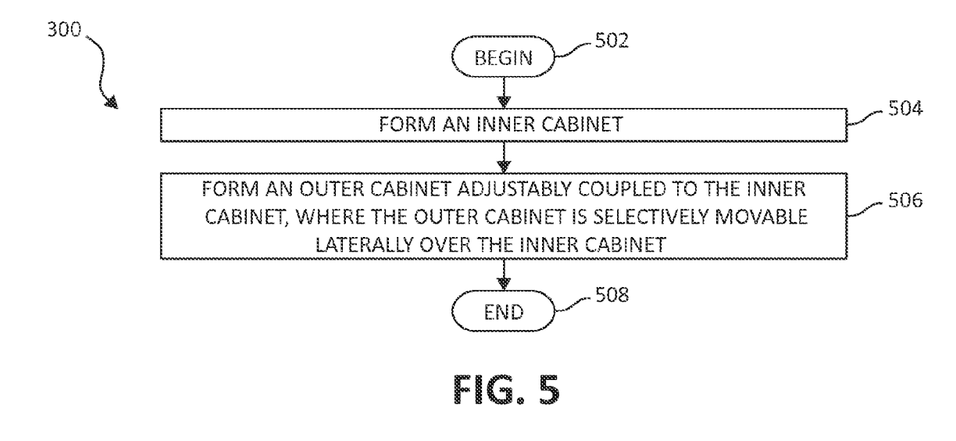
FIG. 5 illustrates a method of manufacturing a rack for computing components according to aspects of the present invention.

FIG. 5 illustrates a method of manufacturing a rack system for mounting a plurality of computing components 300, according to one embodiment of the present invention. Beginning at step 502, an inner cabinet is formed (step 504). An outer cabinet is then formed, the outer cabinet adjustably coupled to the inner cabinet (step 506). The outer cabinet is selectively movable laterally over the inner cabinet to promote flexibility in configuring the plurality of computing components within the inner cabinet in three dimensional space. The method ends (step 508).

In the preceding description, various aspects of the present disclosure have been described. For purposes of explanation, specific numbers, systems and configurations were set forth in order to provide a thorough understanding of the present disclosure. However, it is apparent to one skilled in the art having the benefit of this disclosure that the present disclosure may be practiced without the specific details. In other instances, well-known features, components, or modules were omitted, simplified, combined, or split in order not to obscure the present disclosure.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A rack system for mounting a plurality of computing components, comprising:
   a stationary inner cabinet;
   an outer cabinet, the outer cabinet adjustably coupled to the inner cabinet;
      wherein the outer cabinet is selectively movable laterally over the inner cabinet such that, as the outer cabinet is moved, a space gap of the inner cabinet is adjusted within a confine of the outer cabinet to promote flexibility in configuring the plurality of computing components within the inner cabinet in three dimensional space; wherein:
         when the outer cabinet is moved laterally over the inner cabinet in a first direction, the space gap between the inner cabinet and the outer cabinet is created on a first side, and
         when the outer cabinet is moved laterally over the inner cabinet in a second direction, the space gap between the inner cabinet and the outer cabinet is created on a second, opposing side;
   a track system comprising a notched depth formed and disposed on an inside edge of either of a top and opposing bottom horizontal rail of the outer cabinet;
   a plurality of guide wheels coupled to an outside edge of either of a top and opposing bottom horizontal rail of the inner cabinet, the plurality of guide wheels for positioning inside the track system of the outer cabinet for selectively moving and guiding the outer cabinet upon the plurality of guide wheels of the inner cabinet;
   a plurality of apertures formed horizontally along the track system of the outer cabinet; and
   a releasable latching mechanism disposed through each of the plurality of guide wheels, the releasable latching mechanism comprising a screw pin for engaging one of the plurality of apertures.

2. The rack system of claim 1, wherein the inner cabinet comprises a box frame having a plurality of vertical posts and horizontal rails, the plurality of horizontal rails configured for receiving and structurally supporting the plurality of computing components.

3. The rack system of claim 1, wherein the outer cabinet comprises a box frame having a plurality of vertical posts and horizontal rails, the outer cabinet disposed over the inner cabinet.

4. A rack system for mounting a plurality of computing components, comprising:
   a stationary inner cabinet having a plurality of posts and rails;
   an outer cabinet having a plurality of posts and rails, the outer cabinet disposed over and adjustably coupled to the rails of the inner cabinet;
      wherein the outer cabinet provides a clearance and is selectively movable laterally in a plurality of positions individually over the inner cabinet such that, as the outer cabinet is moved, a space gap of the inner cabinet is adjusted within a confine of the outer cabinet to promote flexibility in configuring a front to back depth ratio of the plurality of computing components within the inner cabinet in three dimensional space; wherein:
         when the outer cabinet is moved laterally over the inner cabinet in a first direction, the space gap between the inner cabinet and the outer cabinet is created on a first side, and
         when the outer cabinet is moved laterally over the inner cabinet in a second direction, the space gap between the inner cabinet and the outer cabinet is created on a second, opposing side;
   a track system comprising a notched depth formed and disposed on an inside edge of either of a top and opposing bottom horizontal rail of the outer cabinet;
   a plurality of guide wheels coupled to an outside edge of either of a top and opposing bottom horizontal rail of the inner cabinet, the plurality of guide wheels for positioning inside the track system of the outer cabinet for selectively moving and guiding the outer cabinet upon the plurality of guide wheels of the inner cabinet;
   a plurality of apertures formed horizontally along the track system of the outer cabinet; and
   a releasable latching mechanism disposed through each of the plurality of guide wheels, the releasable latching mechanism comprising a screw pin for engaging one of the plurality of apertures.

5. The rack system of claim 4, wherein the inner cabinet comprises a box frame having the plurality of vertical posts and horizontal rails, the plurality of horizontal rails configured for receiving and structurally supporting the plurality of computing components.

6. The rack system of claim 4, wherein the outer cabinet comprises a box frame having the plurality of vertical posts and horizontal rails, the outer cabinet disposed over the inner cabinet.

7. A method of manufacturing a rack system for mounting a plurality of computing components, comprising:
   forming a stationary inner cabinet;
   forming an outer cabinet, the outer cabinet adjustably coupled to the inner cabinet;
      wherein the outer cabinet is selectively movable laterally over the inner cabinet such that, as the outer cabinet is moved, a space gap of the inner cabinet is adjusted within a confine of the outer cabinet to promote flexibility in configuring the plurality of computing components within the inner cabinet in three dimensional space; wherein:
         when the outer cabinet is moved laterally over the inner cabinet in a first direction, the space gap between the inner cabinet and the outer cabinet is created on a first side, and
         when the outer cabinet is moved laterally over the inner cabinet in a second direction, the space gap between the inner cabinet and the outer cabinet is created on a second, opposing side;

forming a track system comprising a notched depth formed and disposed on an inside edge of either of a top and opposing bottom horizontal rail of the outer cabinet;

forming a plurality of guide wheels coupled to an outside edge of either of a top and opposing bottom horizontal rail of the inner cabinet, the plurality of guide wheels for positioning inside the track system of the outer cabinet for selectively moving and guiding the outer cabinet upon the plurality of guide wheels of the inner cabinet;

forming a plurality of apertures formed horizontally along the track system of the outer cabinet; and forming a releasable latching mechanism disposed through each of the plurality of guide wheels, the releasable latching mechanism comprising a screw pin for engaging one of the plurality of apertures.

8. The method of claim 7, wherein the inner cabinet comprises a box frame having a plurality of vertical posts and horizontal rails, the plurality of horizontal rails configured for receiving and structurally supporting the plurality of computing components.

9. The method of claim 7, wherein the outer cabinet comprises a box frame having a plurality of vertical posts and horizontal rails, the outer cabinet disposed over the inner cabinet.

\* \* \* \* \*